(12) United States Patent
Winstead et al.

(10) Patent No.: US 7,833,852 B2
(45) Date of Patent: Nov. 16, 2010

(54) SOURCE/DRAIN STRESSORS FORMED USING IN-SITU EPITAXIAL GROWTH

(75) Inventors: Brian A. Winstead, Austin, TX (US); Vishal P. Trivedi, Chandler, AZ (US); Da Zhang, Fishkill, NY (US)

(73) Assignee: Freescale Semiconductor, Inc., Austin, TX (US)

( * ) Notice: Subject to any disclaimer, the term of this patent is extended or adjusted under 35 U.S.C. 154(b) by 38 days.

(21) Appl. No.: 11/781,610

(22) Filed: Jul. 23, 2007

(65) Prior Publication Data
US 2009/0026554 A1 Jan. 29, 2009

(51) Int. Cl.
*H01L 21/335* (2006.01)

(52) U.S. Cl. .............. 438/197; 438/739; 257/E21.435

(58) Field of Classification Search ............ 438/933, 438/739, 197, 680, 682, 689, 706, 733, 734; 257/350
See application file for complete search history.

(56) References Cited

U.S. PATENT DOCUMENTS

| 6,621,131 | B2 |  | 9/2003 | Murthy et al. |  |
| 6,949,482 | B2 | * | 9/2005 | Murthy et al. | 438/739 |
| 7,365,378 | B2 | * | 4/2008 | Huang et al. | 257/288 |
| 7,384,835 | B2 | * | 6/2008 | Chen et al. | 438/197 |
| 2003/0218214 | A1 | * | 11/2003 | Tsuchiya et al. | 257/350 |
| 2007/0196992 | A1 | * | 8/2007 | Xiang et al. | 438/320 |

OTHER PUBLICATIONS

Da Zhang and Brian A. Winstead, "Source/Drain Stressor and Method Therefor" U.S. Appl. No. 11/680,181, filed Feb. 28, 2007.
M. Horstmann, et al., "Integration and Optimization of Embedded-SiGe, Compressive and Tensile Stressed Liner Films, and Stress Memorization in Advanced SOI CMOS Technologies" Electron Devices Meeting, 2005. IEDM Technical Digest. IEEE International, Dec. 5-7, 2005 pp. 233-236.
Ryuta Tsuchiya, et al., "Femto-Second CMOS Technology with High-k Offset Spacer and SiN Gate Dielectric with Oxygen-enriched Interface," Symposium On VLSI Technology Digest of Technical Papers 2002, pp. 150-151.

* cited by examiner

*Primary Examiner*—Steven Loke
*Assistant Examiner*—Earl N Taylor
(74) *Attorney, Agent, or Firm*—Kim-Marie Vo; Daniel D. Hill

(57) ABSTRACT

A method for forming a semiconductor device is provided. The method includes forming a semiconductor layer. The method further includes forming a gate structure overlying the semiconductor layer. The method further includes forming a high-k sidewall spacer adjacent to the gate structure. The method further includes forming a recess in the semiconductor layer, the recess aligned to the high-k sidewall spacer. The method further includes forming an in-situ doped epitaxial material in the recess, the epitaxial material having a natural lattice constant different from a lattice constant of the semiconductor layer to create stress in a channel region of the semiconductor device.

8 Claims, 5 Drawing Sheets

SOURCE/DRAIN STRESSORS FORMED USING IN-SITU EPITAXIAL GROWTH

BACKGROUND

1. Field

This disclosure relates generally to semiconductor devices, and more specifically, to source/drain stressors formed using in-situ epitaxial growth.

2. Related Art

To obtain high channel strain from source/drain stressors, the source/drain stressors should be incorporated as close as possible to the channel. When source/drain stressors are grown epitaxially in recesses adjacent to the gate, the recesses require a hydrofluoric acid clean (HF clean) prior to the growth of the source/drain stressors. The materials used for HF clean can, however, attack the gate oxide. To prevent the negative effect of HF clean on gate oxide, the source/drain stressors must be formed at some distance from the channel. Separation between the source/drain region and the channel region creates high series resistance.

Conventionally, the high series resistance in the source/drain region has been reduced by implanting dopants in the source/drain region and annealing the region. Implanting of dopants into source/drain regions can cause other problems. For example, implantation of dopants can cause the stressor layers to relax. The relaxed stressor layers create lower strain in the channel region and thus are not as effective. Additionally, both implantation and annealing can result in a less abrupt change in doping profile from the channel region to the source/drain regions.

Accordingly, there is a need for source/drain regions that stress the channel region and that are formed using in-situ doped epitaxial growth.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Semiconductor devices, including method of making the same, are provided. Exemplary semiconductor devices include a structure with a high-k zero spacer, which is aligned with a fully in-situ doped source/drain extension stressor. The etching step to form the recesses in which the in-situ doped epitaxial regions are formed is defined using the high-k spacer, as a mask.

In one aspect, a method for forming a semiconductor device is provided. The method includes forming a semiconductor layer and forming a gate structure overlying the semiconductor layer. The method further includes forming a high-k sidewall spacer adjacent to the gate structure. The method further includes forming a recess in the semiconductor layer, the recess aligned to the high-k sidewall spacer. The method further includes forming an in-situ doped epitaxial material in the recess, the epitaxial material having a natural lattice constant different from a lattice constant of the semiconductor layer to create stress in a channel region of the semiconductor device.

In another aspect, a method for forming a semiconductor device is provided. The method includes forming a semiconductor layer, forming a gate dielectric layer, and forming a gate structure over the gate dielectric layer. The method further includes forming a high-k sidewall spacer adjacent to the gate structure, the high-k sidewall spacer having a dielectric constant greater than a dielectric constant of silicon oxynitride. The method further includes forming a recess in the semiconductor layer, the recess aligned to the high-k sidewall spacer. The method further includes forming an in-situ doped epitaxial material in the recess, the epitaxial material having a natural lattice constant different from a lattice constant of the semiconductor layer to create stress in a channel region of the semiconductor device. The method further includes forming a spacer adjacent to the high-k sidewall spacer. The method further includes siliciding a portion of the in-situ doped epitaxial material and the gate structure, wherein a virtual source/drain extension region is formed by the high-k sidewall spacer in response to a bias voltage being applied to the gate structure.

In yet another aspect, a semiconductor device including a semiconductor layer and a gate dielectric formed over the semiconductor layer is provided. The semiconductor device further includes a high-k sidewall spacer adjacent to the gate structure, the high-k sidewall spacer having a dielectric constant greater than a dielectric constant of silicon oxynitride. The semiconductor device further includes a recess formed in the semiconductor layer, the recess aligned to the high-k sidewall spacer. The semiconductor device further includes an in-situ doped epitaxial material in the recess, the epitaxial material having a natural lattice constant different from a lattice constant of the semiconductor layer to create stress in a channel region of the semiconductor device.

Figure 1:
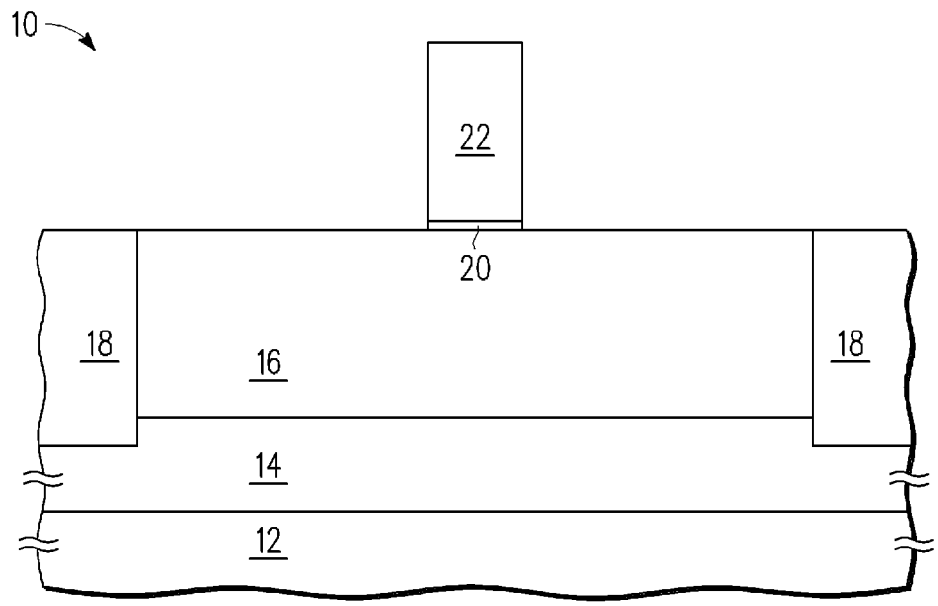
FIG. 1 is a view of a semiconductor device during a processing step.

FIG. 1 shows a view of a semiconductor device 10 during a processing step. Semiconductor device 10 may comprise a device formed using semiconductor material on a buried oxide layer (BOX) 14, over a substrate 12. The semiconductor material described herein can be any semiconductor material or combinations of materials, such as gallium arsenide, silicon germanium, silicon, the like, and combinations of the above. Semiconductor device 10 may further comprise a semiconductor layer 16. Semiconductor layer 16 may be doped to form a p-type layer or to form an n-type layer. Semiconductor layer may be isolated from other semiconductor layers using an isolation region 18. As a first step, a gate dielectric layer 20 may be formed over semiconductor layer 16. Gate dielectric layer 20 may be deposited using a chemical vapor deposition or a physical vapor deposition process. Gate dielectric layer 20 may be a high-K dielectric layer formed using oxides of hafnium, aluminum, molybdenum, titanium, tantalum, zirconium, silicon, or any other suitable element. Gate dielectric layer 20 may also be a thermally grown or a deposited silicon oxide layer. Gate dielectric layer 20 may also contain nitrogen. Gate dielectric layer 20 may also be a combination of a deposited silicon oxide layer and a deposited high-K dielectric layer. Gate dielectric layer 20 may have a thickness in a range of 1 to 5 nanometers. A gate structure 22 may be formed over gate dielectric layer 20. Gate structure 22 may be a polysilicon gate structure having only a single layer of polysilicon. Gate structure 22 may also be a single metal layer. Alternatively, gate structure 22 may be a multi-layer structure, including polysilicon and/or metal layers.

Figure 2:
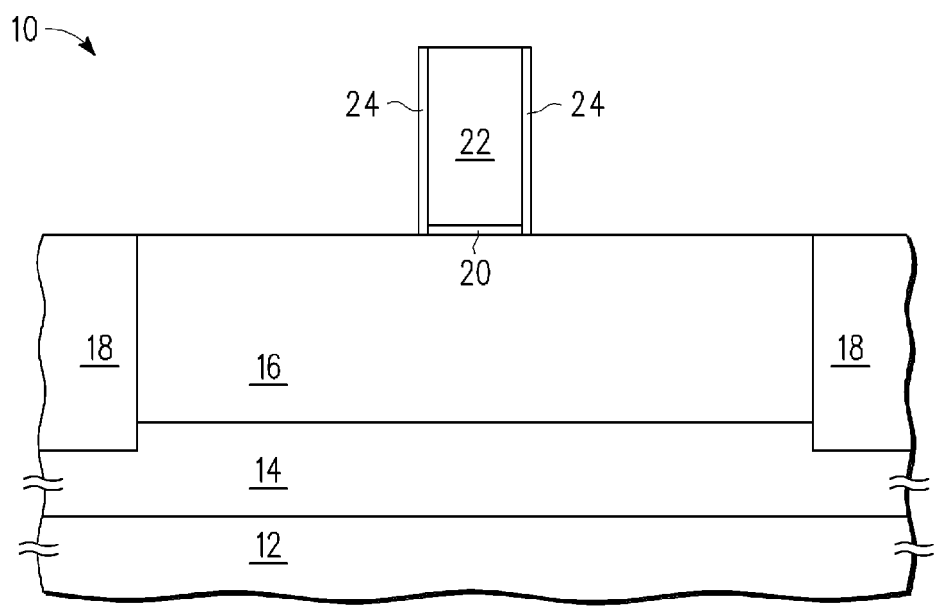
FIG. 2 is a view of a semiconductor device during a processing step.

Next, as shown in FIG. 2, a sidewall spacer 24 may be formed adjacent gate structure 22. Sidewall spacer 24 may be formed using a high-k dielectric material. As used herein the term, "high-k dielectric" includes materials having a dielectric constant greater than the dielectric constant for silicon nitride, materials having a dielectric constant greater than 7 (preferably, 7.5), or materials having a dielectric constant greater than the dielectric constant for oxynitride. In another embodiment, high-k dielectric material may have a dielectric constant greater than 10. In one embodiment, sidewall spacer 24 must have a dielectric constant greater than the dielectric constant for silicon nitride. Sidewall spacer 24 may be formed from a material comprising one or more of a group consisting of tantalum, zirconium, hafnium, lanthanum, yttrium, and strontium. Sidewall spacer 24 may be formed of a material that is an oxide or silicate of tantalum, zirconium, or hafnium. Sidewall spacer 24 may be formed of a material that is an oxide of lanthanum, yttrium, or strontium. Sidewall spacer 24 may have a thickness in a range of 4-6 nanometers. Alternatively, sidewall spacer 24 may have a thickness in a range of 2-10 nanometers. Sidewall spacer 24 creates a lower resistance area under it, which can be viewed as creating a virtual source/drain extension region. In other words, the same effect as an actual source/drain extension is achieved using the virtual source/drain extension, which is created when a bias voltage is applied to gate structure 22.

Figure 3:
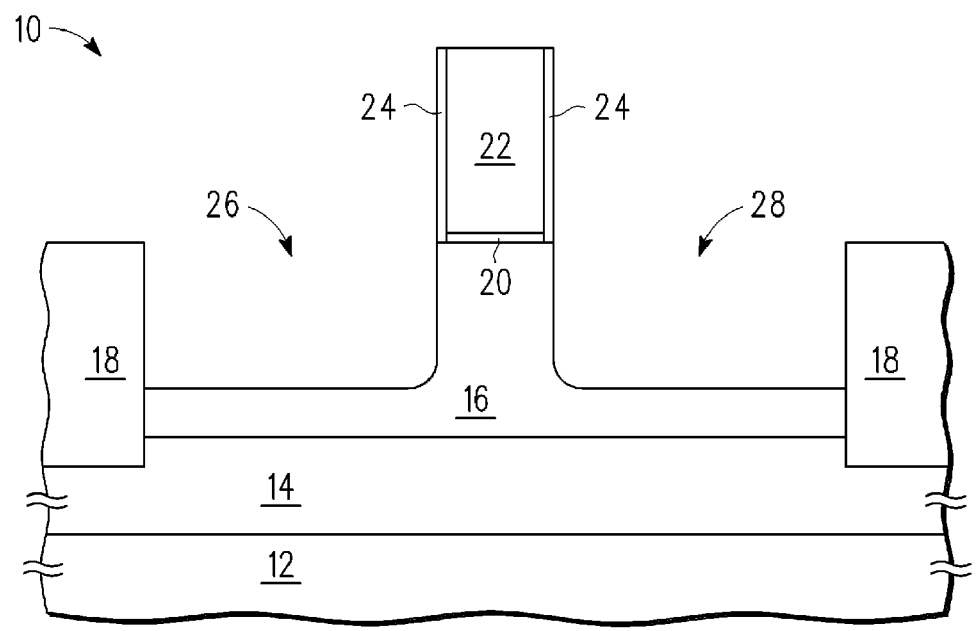
FIG. 3 is a view of a semiconductor device during a processing step.

Next, as shown in FIG. 3, a recess 26 and a recess 28 may be formed in semiconductor material layer 16. Recess 26 may be formed on the source side and is formed aligned to sidewall spacer 24. Recess 28 may be formed on the drain side and is formed aligned to sidewall spacer 24. Recess 26 and recess 28 may be formed using sidewall spacer 24 and gate structure 22 as a mask and etching semiconductor material 16.

Figure 4:
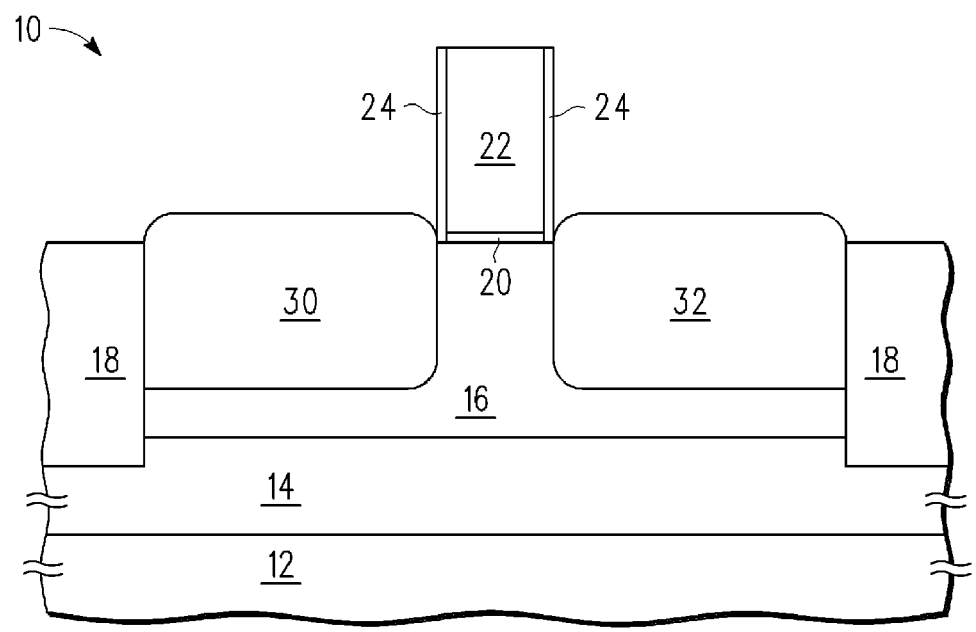
FIG. 4 is a view of a semiconductor device during a processing step.

Next, as shown in FIG. 4, in-situ doped epitaxial regions 30 and 32 may be formed, in recess 26 and recess 28, respectively. In one embodiment, where semiconductor device 10 is a P-channel device, in-situ doped epitaxial regions 30 and 32 may include silicon germanium in-situ doped with one of a group consisting of Boron, BF2, and Indium. In another embodiment, where semiconductor device 10 is an N-channel device, in-situ doped epitaxial regions 30 and 32 may include silicon carbon in-situ doped with one of a group consisting of Phosphorous, Arsenic, and Antimony.

Figure 5:
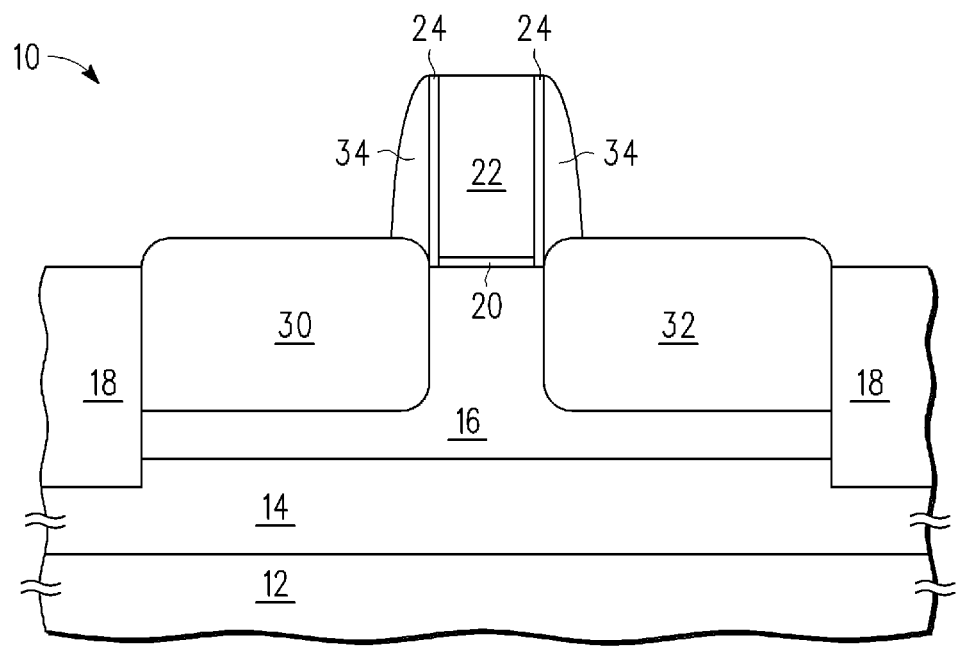
FIG. 5 is a view of a semiconductor device during a processing step.

Next, as shown in FIG. 5, sidewall spacer 34 may be formed adjacent to sidewall spacer 24. Sidewall spacer 34 is preferably nitride but could be another material or combination of materials. Sidewall spacer 34 is preferably thicker than sidewall spacer 24. By way of example, sidewall spacer 34 may have a lateral thickness of about 40 nanometers at the thickest point.

Figure 6:
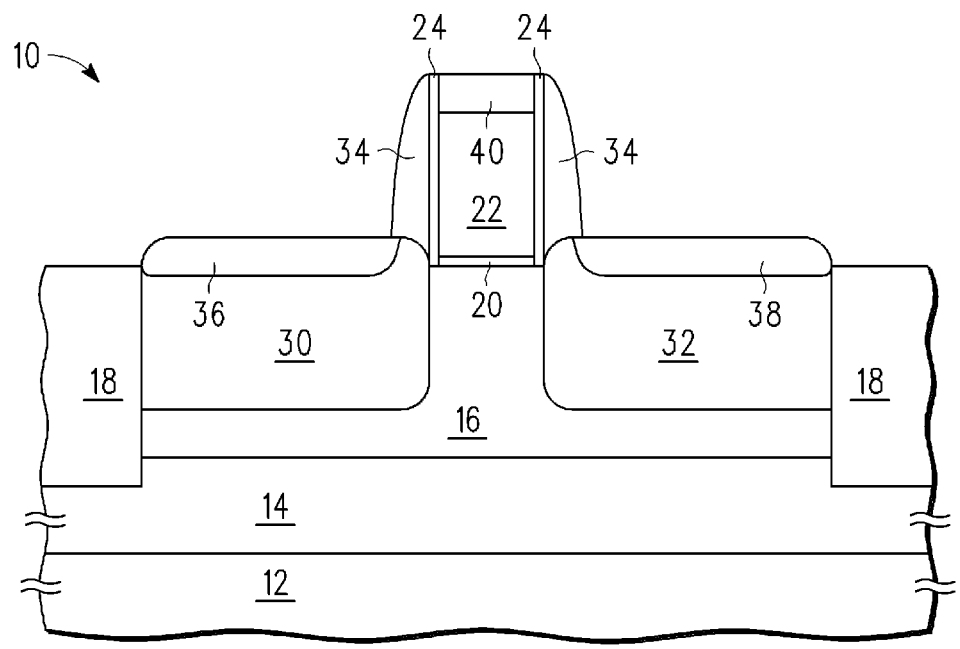
FIG. 6 is a view of a semiconductor device during a processing step.

Next, as shown in FIG. 6, silicide regions 36, 38, and 40 may be formed. Although not shown, additional semiconductor processing steps, including formation of inter-dielectric layers, contacts, deep source/drain regions, may be performed.

Figure 7:
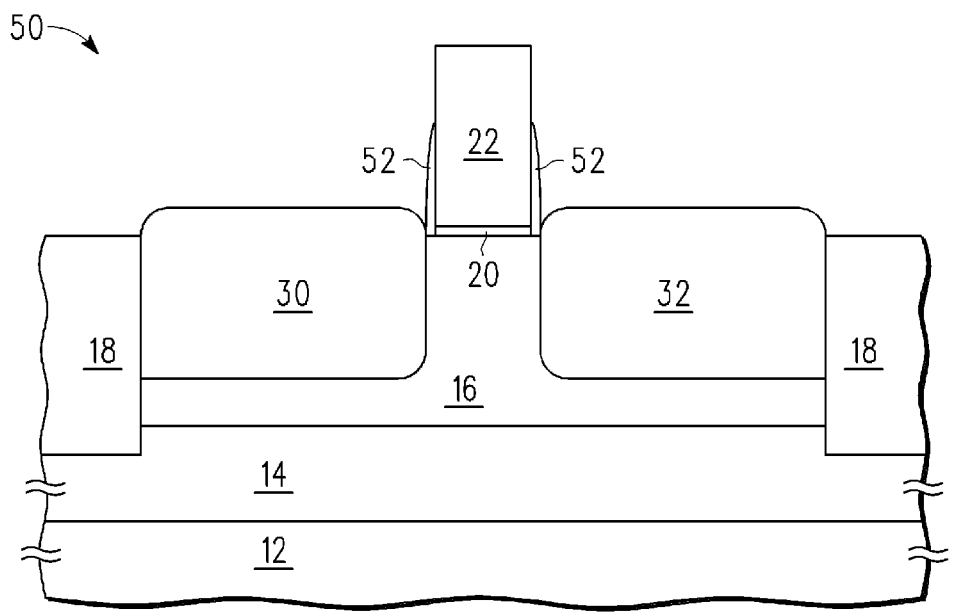
FIG. 7 is a view of a semiconductor device during a processing step.

FIG. 7 shows a view of a semiconductor device 50 during a processing step. By way of example, subsequent to the processing step shown in FIG. 4, semiconductor device 10 may be subjected to the step shown in FIG. 7. In particular, semiconductor device 50 may be formed by etching sidewall spacer 24, resulting in tapered sidewall spacer 52, shown in FIG. 7. Any etch process, such as wet or dry could be used. Etching of sidewall spacer 24 will reduce the parasitic capacitance associated with the spacer.

Figure 8:
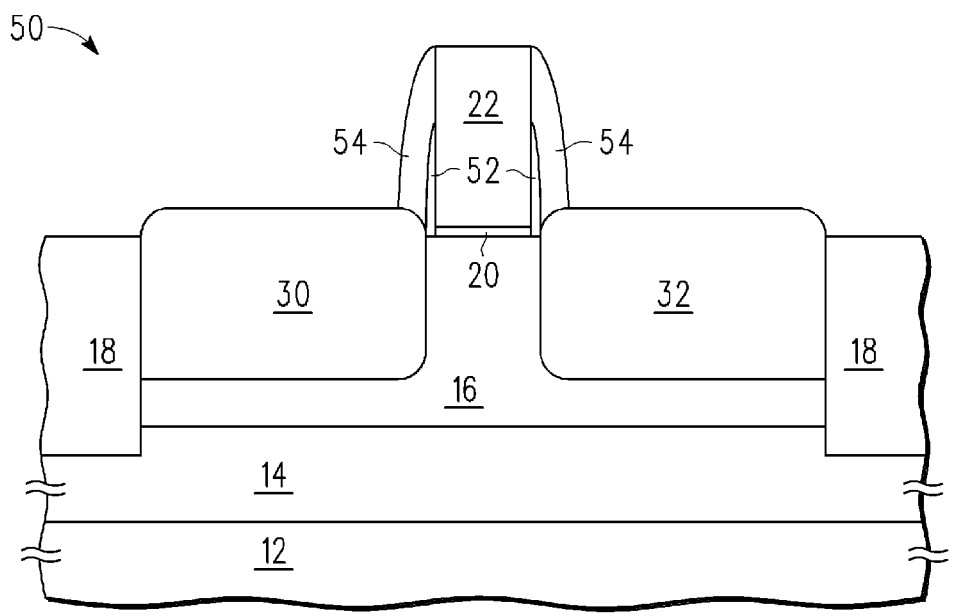
FIG. 8 is a view of a semiconductor device during a processing step.

Next, as shown in FIG. 8, sidewall spacer 54 may be formed adjacent to sidewall spacer 52. Sidewall spacer 54 is preferably nitride but could be another material or combination of materials.

Figure 9:
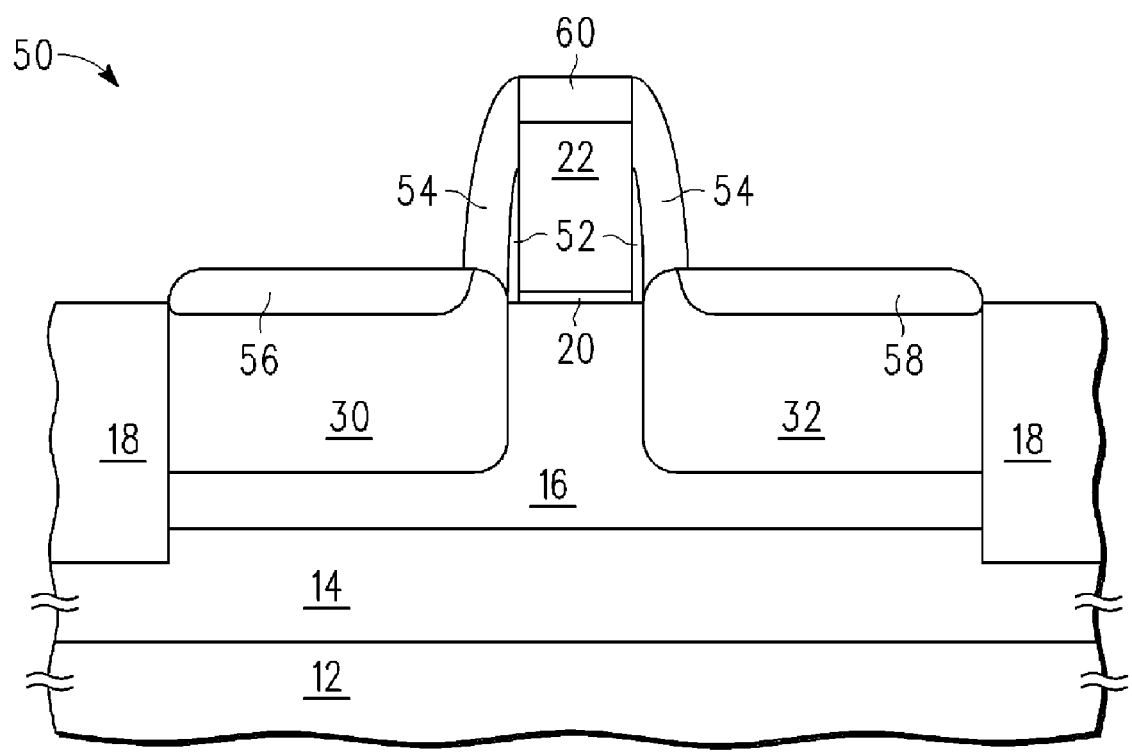
FIG. 9 is a view of a semiconductor device during a processing step.

Next, as shown in FIG. 9, silicide regions 56, 58, and 60 may be formed. Although not shown, additional semiconductor processing steps, including formation of inter-dielectric layers, contacts, deep source/drain regions, may be performed.

Although the invention has been described with respect to specific conductivity types or polarity of potentials, skilled artisans appreciated that conductivity types and polarities of potentials may be reversed.

Although the invention is described herein with reference to specific embodiments, various modifications and changes can be made without departing from the scope of the present invention as set forth in the claims below. For example, although the process steps for forming semiconductor devices 10 and 50 are described as being performed in a certain order, they need not be formed in the order described. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for forming a semiconductor device, comprising:

forming a semiconductor layer;

forming a gate dielectric layer over the semiconductor layer;

forming a gate structure over the gate dielectric layer;

forming a high-k sidewall spacer adjacent to the gate structure, the high-k sidewall spacer having a dielectric constant greater than a dielectric constant of silicon oxynitride;

using the high-k sidewall spacer to form a recess in the semiconductor layer, wherein the recess is aligned to the high-k sidewall spacer and does not undercut the high-k sidewall spacer;

forming an in-situ doped epitaxial material in the recess, the epitaxial material having a natural lattice constant different from a lattice constant of the semiconductor layer to create stress in a channel region of the semiconductor device;

etching the high-k sidewall spacer to form a tapered high-k sidewall spacer after forming the in-situ doped epitaxial material in the recess;

forming a spacer adjacent to the tapered high-k sidewall spacer; and siliciding a portion of the in-situ doped epitaxial material and the gate structure.

2. The method of claim 1, wherein the high-k sidewall spacer has a dielectric constant greater than 7.5.

3. The method of claim 1, wherein the high-k sidewall spacer has a width in a range of 2 to 10 nanometers (nm).

4. The method of claim, wherein the high-k sidewall spacer has a width in a range of 4 to 6 nanometers (nm).

5. The method of claim 1, wherein the high-k sidewall spacer may be formed from a material comprising one or more of a group consisting of tantalum, zirconium, hafnium, lanthanum, yttrium, and strontium.

6. The method of claim 1, wherein the semiconductor device is a P-channel device and wherein the in-situ doped epitaxial material comprises silicon germanium in-situ doped with one of a group consisting of Boron, $BF_2$, and Indium.

7. The method of claim 1, wherein the semiconductor device is an N-channel device and wherein the in-situ doped epitaxial material comprises silicon carbon in-situ doped with one of a group consisting of Phosphorous, Arsenic, and Antimony.

8. The method of claim 1, wherein the high-k sidewall spacer forms a virtual source/drain extension region underneath the high-k sidewall spacer when a bias voltage is applied to the gate structure.

* * * * *